(12) United States Patent
Terashima et al.

(10) Patent No.: US 9,595,632 B2
(45) Date of Patent: Mar. 14, 2017

(54) METHOD FOR PRODUCING GAN-BASED CRYSTAL AND SEMICONDUCTOR DEVICE (71) Applicants: NITTO OPTICAL CO., LTD., Tokyo (JP); SOLARTES Lab., Ltd., Kanagawa (JP); Yoko Terashima, Kanagawa (JP)

(72) Inventors: Kazutaka Terashima, Kanagawa (JP); Suzuka Nishimura, Kanagawa (JP); Muneyuki Hirai, Kanagawa (JP)

(73) Assignees: NITTO OPTICAL CO., LTD., Tokyo (JP); SOLARTES Lab., Ltd., Kanagawa (JP)

(*) Notice: Subject to any disclaimer, the term of this patent is extended or adjusted under 35 U.S.C. 154(b) by 0 days.

(21) Appl. No.: 14/629,063

(22) Filed: Feb. 23, 2015

(65) Prior Publication Data
US 2015/0194569 A1  Jul. 9, 2015

Related U.S. Application Data (63) Continuation of application No. PCT/JP2013/072922, filed on Aug. 27, 2013.

(30) Foreign Application Priority Data

Aug. 29, 2012  (JP) ................. 2012-188461

(51) Int. Cl.
H01L 33/00 (2010.01)
H01L 33/32 (2010.01)
(Continued)

(52) U.S. Cl.
CPC ........ H01L 33/0025 (2013.01); C23C 16/303 (2013.01); H01L 21/0251 (2013.01);
(Continued)

(58) Field of Classification Search
CPC . H01L 33/06; H01L 33/0025; H01L 33/0066; H01L 33/0075–33/0079
(Continued)

(56) References Cited

U.S. PATENT DOCUMENTS 6,291,842 B1* 9/2001 Nakayama .......... H01L 29/7783
257/194
2003/0160253 A1* 8/2003 Udagawa ............... H01L 33/02
257/85
(Continued)

FOREIGN PATENT DOCUMENTS

JP  2000-235956     8/2000
JP  2000-351692 A  12/2000
(Continued)

OTHER PUBLICATIONS

International Search Report and Written Opinion dated Nov. 26, 2013 from corresponding International Application No. PCT/JP2013/072922; 5 pgs.
(Continued)

Primary Examiner — Christine Enad
(74) Attorney, Agent, or Firm — Maier & Maier, PLLC (57) ABSTRACT A method for producing a GaN-based crystal includes forming a Zinc-blend type BP crystal layer on a Si substrate; forming an In-containing layer, on the BP crystal layer, with such a thickness as to keep the Zinc-blend type structure; and forming a Zinc-blend type GaN-based crystal layer on the In-containing layer. The In-containing layer is a metallic In layer having a thickness of 4 atom layers or less, an InGaN layer having a thickness of 2 nm or less, an InAl mixture layer having a thickness of 4 atom layers or less and containing Al at 10% or less, or an AlInGaN layer having a thickness of 2 nm or less and containing Al at 10% or less.

11 Claims, 7 Drawing Sheets

(51) Int. Cl.
  *H01L 33/16* (2010.01)
  *H01L 21/02* (2006.01)
  *C23C 16/30* (2006.01)
  *H01L 33/06* (2010.01)

(52) U.S. Cl.
  CPC ...... *H01L 21/0254* (2013.01); *H01L 21/0262* (2013.01); *H01L 21/02381* (2013.01); *H01L 21/02433* (2013.01); *H01L 21/02458* (2013.01); *H01L 21/02461* (2013.01); *H01L 21/02491* (2013.01); *H01L 21/02505* (2013.01); *H01L 33/007* (2013.01); *H01L 33/0066* (2013.01); *H01L 33/0075* (2013.01); *H01L 33/0079* (2013.01); *H01L 33/06* (2013.01); *H01L 33/16* (2013.01); *H01L 33/32* (2013.01)

(58) Field of Classification Search
  USPC .................................................. 438/47, 478
  See application file for complete search history.

(56) References Cited

U.S. PATENT DOCUMENTS

| | | | |
|---|---|---|---|
| 2006/0043506 A1* | 3/2006 | Udagawa | H01L 29/2003 257/414 |
| 2007/0194335 A1* | 8/2007 | Udagawa | H01L 33/32 257/94 |
| 2009/0127571 A1* | 5/2009 | Udagawa | C30B 23/02 257/94 |
| 2010/0052016 A1* | 3/2010 | Hooper | C30B 23/02 257/201 |

FOREIGN PATENT DOCUMENTS

| | | |
|---|---|---|
| JP | 2001-053338 A | 2/2001 |
| JP | 2002-009340 A | 1/2002 |
| JP | 2003-229601 | 8/2003 |
| JP | 2003-282450 A | 10/2003 |
| JP | 2004-063519 A | 2/2004 |
| JP | 2004-134812 A | 4/2004 |
| JP | 2007-067323 A | 3/2007 |
| TW | I263359 B | 10/2006 |

OTHER PUBLICATIONS

Taiwanese Office Action dated Mar. 24, 2016, in connection with corresponding TW Application No. 103103169 (11 pgs., including English translation).

Japanese Office Action dated Jun. 7, 2016, in connection with corresponding JP Application No. 2012-188461 (2 pgs.).

Taiwanese Office Action dated Oct. 21, 2016, in connection with corresponding TW Application No. 103103169 (10 pgs., including partial English translation).

Great Britain Office Action dated Nov. 1, 2016, in connection with corresponding GB Application No. GB1503010.9 (5 pgs.).

* cited by examiner

METHOD FOR PRODUCING GAN-BASED CRYSTAL AND SEMICONDUCTOR DEVICE

CROSS REFERENCE TO RELATED APPLICATION

This application is based upon and claims the benefit of priority from the prior Japanese Patent Application No. 2012-188461, filed on Aug. 29, 2012, and PCT Application No. PCT/JP2013/072922, filed on Aug. 27, 2013, the entire contents of which are incorporated herein by reference.

FIELD

The present invention relates to a method for producing a GaN-based crystal and a semiconductor device, and particularly to a method by which a BP crystal is formed on a Si substrate and a GaN-based crystal, which is a Zinc-blende type crystal, is grown thereon.

BACKGROUND

GaN-based crystals are used for short-wavelength light emitting devices. Usually, a GaN-based crystal is epitaxially grown on a sapphire substrate. Instead of this method, it is desired to epitaxially grow a GaN-based crystal having a low dislocation density on a Si substrate. GaN-based crystals are available in two different crystal structures, namely, a wurtzite-type structure having a superb piezoelectric characteristic and a Zinc-blende type structure that has almost no piezoelectric characteristic and has a high capability in information transfer or information processing. Generally, a wurtzite-type structure crystal is stably grown at high temperature. Meanwhile, a Zinc-blende type structure crystal, which is metastable, promotes a good recombination and therefore, when being used for a short-wavelength light emitting device, significantly increases the light emission efficiency of the device. For this reason, a technology for growing a Zinc-blende type structure crystal at a low dislocation density is strongly desired. In addition, a GaN-based crystal of a Zinc-blende type structure having a low dislocation density, when obtained, realizes, for example, a composite device of a short-wavelength light emitting device and a semiconductor integrated circuit. Such a device will be developed into a variety of useful devices in the future.

The present inventor reported an example of forming a GaN crystal directly on a BP crystal film that is formed on a Si substrate (Japanese Laid-Open Patent Publication No. 2003-229601). However, in actuality, phenomena that the crystal has a roughened surface, is partially delaminated, is cracked, or the like occasionally occur. There is another example in which a GaN-based crystal is formed on a BP crystal film that is formed on a Si substrate with an intermediate layer being located between the GaN-based crystal and the BP crystal film (Japanese Laid-Open Patent Publication No. 2000-235956). In this case, a Zinc-blende type GaN-based crystal is not formed.

SUMMARY

The present invention has an object of providing a technology for growing a Zinc-blende type GaN-based crystal having a low dislocation density on a Si substrate having a (100) plane by use of a Zinc-blende type BP crystal as an intermediate crystal.

An embodiment according to the present invention provides a method for producing a GaN-based crystal, including forming a BP crystal layer of a Zinc-blende type structure on a Si substrate; forming an In-containing layer, on the BP crystal layer, with such a thickness as to keep the Zinc-blende type structure; and forming a GaN-based crystal layer of the Zinc-blende type structure on the In-containing layer.

It is preferable that the In-containing layer is a metallic In layer having a thickness of 4 atom layers or less.

It is preferable that the In-containing layer is an InGaN layer having a thickness of 2 nm or less.

It is preferable that the In-containing layer is an InAl mixture layer having a thickness of 4 atom layers or less and contains Al at a content of 10% or less.

It is preferable that the In-containing layer is an AlInGaN layer having a thickness of 2 nm or less and contains Al at a content of 10% or less.

It is preferable that the In-containing layer is a superlattice layer obtained by repeatedly stacking $Al_xIn_yGa_{1-x-y}N$ and $Al_{x'}In_{y'}Ga_{1-x'-y'}N$ layers.

It is preferable that the Si substrate has an off-angle of 3° or greater and 23° or less with respect to a (100) plane.

An embodiment according to the present invention provides a method for producing a GaN-based crystal, including forming a BP crystal layer of a Zinc-blende type structure that has a Si concentration of $10^{17}$ cm$^{-3}$ or greater and $10^{21}$ cm$^{-3}$ or less on a Si substrate; and forming a GaN-based crystal layer of the Zinc-blende type structure at a position above the BP crystal layer.

The present invention further provides a light emitting device, including the GaN-based crystal produced by any of the above-described methods; and a double-heterojunction formed on the GaN-based crystal.

The present invention further provides a method for producing a light emitting device, including removing, from the GaN-based crystal produced by any of the above-described methods, the Si substrate by use of the BP crystal layer as an etching stopper.

According to the present invention, a Zinc-blende type GaN-based crystal having a low dislocation density can be grown on a Si substrate having a (100) plane by use of a BP crystal as an intermediate crystal.

DESCRIPTION OF EMBODIMENTS

Hereinafter, several examples in which the present invention is carried out will be described. The present invention is not limited to any of the following examples, and these examples may be modified in any of various manners to carry out the present invention.

Example 1

Figure 1:
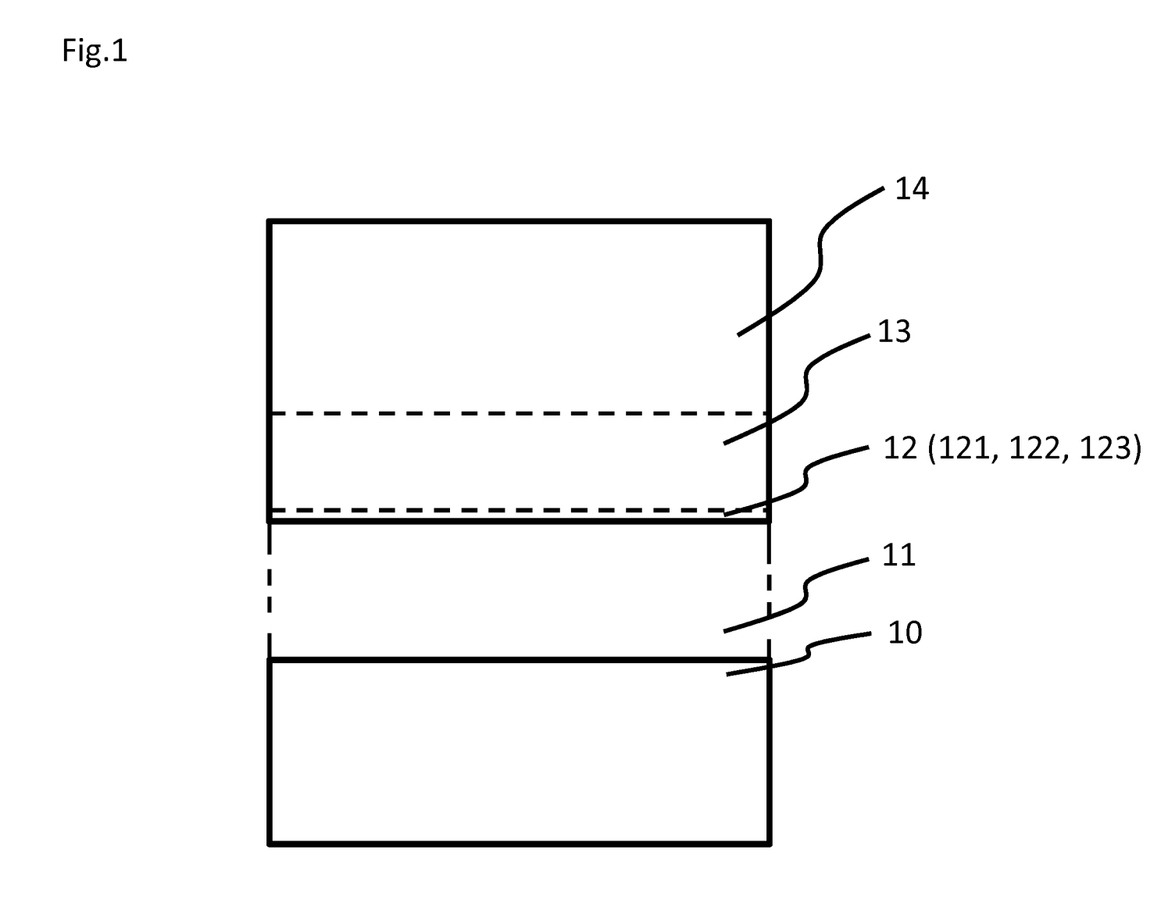
FIG. 1 is a cross-sectional view showing a post-crystal growth state in each of examples 1 through 4 according to the present invention.

Hereinafter, a method for growing a GaN-based crystal in example 1 according to the present invention ($Al_xIn_yGa_{1-x-y}N$ crystal) will be described with reference to FIG. 1.

First, a P(phosphorus)-doped n-type Si substrate 10 is prepared. The Si substrate 10 has a (100) plane. Herein, an off-substrate sliced at an angle of 6 degrees toward the <110> direction is used as the Si substrate 10.

The temperature of a reactor accommodating the Si substrate 10 is raised to 1000° C., and $PH_3$ (phosphine) and $B_2H_6$ (diborane) are caused to flow for about 1 hour to form a BP crystal film 11 (intermediate crystal) having a thickness of 500 nm. Since the temperature of the reactor is 1000° C., Si atoms are diffused from the Si substrate into the BP crystal film 11. As a result, the BP crystal film 11 contains a Si concentration of about $10^{18}$ $cm^{-3}$. After this step, the temperature of the substrate is lowered.

The Si substrate 10 having the BP crystal film 11 formed thereon is transferred to another reactor while being kept in a nitrogen atmosphere without being exposed to the atmosphere. The temperature of the substrate is raised to 1100° C., and a surface of the substrate is treated with hydrogen for 5 minutes. Next, the temperature of the substrate is lowered to 650° C., and $(C_2H_5)_3In$ (trimethylindium) is caused to flow for only 1 second to deposit an In film 12 having a thickness of about 1 atom layer (about 0.5 nm).

After the In (Indium) film 12 is deposited, $CH_3$—NH—$NH_2$ (monomethylhydrazine) and $(C_2H_5)_3Ga$ (trimethylgallium) are flowed in the reactor for about 1500 seconds to deposit a GaN film 13 depositing 20 nm in thickness.

After the GaN film 13 having a thickness of 20 nm is deposited, the temperature of the reactor is raised to 730° C., and both monomethylhydrazine and $(C_2H_5)_3Ga$ (trimethylgallium) are flowed in the reactor for about 3600 seconds to deposit a GaN film 14 having a thickness of about 1 μm.

The GaN film deposited as described above had a good Zinc-blende type crystal structure and had a dislocation density of about $10^6$ $cm^{-2}$.

A conceivable reason why the Zinc-blende type GaN film is formed by the above-described method for growing the GaN film is as follows. The BP crystal film 11 on the Si substrate 10 is of the Zinc-blende type. The In film having a thickness of 1 atom layer is thin and thus keeps the Zinc-blende type crystal structure of the film therebelow, and therefore, the GaN film formed thereon is also of the Zinc-blende type. When the GaN film is deposited, the In film having a thickness of about 1 atom layer is detected as an In spot.

A reason why a good GaN film having a low dislocation density is formed by the above-described method for growing the GaN film is as follows. The BP crystal has a lattice constant of about 0.454 nm, and the GaN crystal has a lattice constant of about 0.451 nm. An InGaN crystal has a larger lattice constant when having a higher ratio of In. Therefore, the In film 12 provided by the above-described growth method and the GaN film formed thereon effectively act together as InGaN having a relatively high content of In, and this cancels the mismatch of the lattice constant between the BP crystal and the GaN crystal. Based on this lattice matching, another embodiment is conceivable in which a thin InGaN film having a relatively high In content is provided between the BP crystal and the GaN crystal. This will be described in example 2 as follows.

In the above-described method for growing the GaN film, the In film has a thickness of about 1 atom layer. It has been confirmed that substantially the same effect is provided even in the case where an In film having a thickness of about 5 atom layers at the maximum is formed.

Example 2

Hereinafter, a method for growing a GaN-based crystal in example 2 will be described with reference to FIG. 1.

First, like in example 1, a BP crystal film 11 having a thickness of 500 nm is formed on a P-doped n-type Si substrate 10.

The Si substrate 10 having the BP crystal film 11 formed thereon is transferred to another reactor while being kept in a nitrogen atmosphere without being exposed to the atmosphere. The temperature of the substrate is raised to 1100° C., and a surface of the substrate is treated with hydrogen for 5 minutes. Next, the temperature of the substrate is lowered to 650° C., and $CH_3$—NH—$NH_2$ (monomethylhydrazine), $(C_2H_5)_3Ga$ (trimethylgallium) and $(C_2H_5)_3In$ (trimethylindium) are caused to flow for 10 seconds to deposit an InGaN film 121 having a thickness of about one to several atom layers (about 0.5 to 2 nm). The InGaN film 121 is thin and thus keeps the Zinc-blende type crystal structure of the film therebelow.

After the InGaN film 121 is deposited, $CH_3$—NH—$NH_2$ (monomethylhydrazine) and $(C_2H_5)_3Ga$ (trimethylgallium) are caused to flow in the reactor for about 1500 seconds to deposit a GaN film 13 having a thickness of 20 nm.

After the GaN film 13 having a thickness of 20 nm is deposited, the temperature of the reactor is raised to 730° C., and monomethylhydrazine and $(C_2H_5)_3Ga$ (trimethylgallium) are caused to flow in the reactor for about 3600 seconds to deposit a GaN film 14 having a thickness of about 1 μm.

The GaN film deposited as described above had a good Zinc-blende type crystal structure and had a dislocation density of about $10^6$ $cm^{-2}$.

Example 3

Hereinafter, a method for growing a GaN-based crystal in example 3 will be described with reference to FIG. 1.

First, like in example 1, a BP crystal film 11 having a thickness of 500 nm is formed on a P-doped n-type Si substrate 10.

The Si substrate 10 having the BP crystal film 11 formed thereon is transferred to another reactor while being kept in a nitrogen atmosphere without being exposed to the atmosphere. The temperature of the substrate is raised to 1100° C., and a surface of the substrate is treated with hydrogen for 5 minutes. Next, the temperature of the substrate is lowered to 650° C., and $(C_2H_5)_3In$ (trimethylindium) and $(C_2H_5)_3Al$ (trimethylaluminum) are caused to flow for only 1 second to deposit an InAl mixture film 122 having a thickness of about 1 atom layer (about 0.5 nm). The InAl mixture film 122 is thin and thus keeps the Zinc-blende type crystal structure of the film therebelow. Flow rates of the gases are adjusted such that the amount of Al is much smaller than the amount of In.

After the InAl mixture film 122 is deposited, $CH_3$—NH—$NH_2$ (monomethylhydrazine) and $(C_2H_5)_3Ga$ (trimethylgallium) are caused to flow in the reactor for about 1500 seconds to deposit a GaN film 13 having a thickness of 20 nm.

After the GaN film 13 having a thickness of 20 nm is deposited, the temperature of the reactor is raised to 730° C., and monomethylhydrazine and $(C_2H_5)_3Ga$ (trimethylgallium) are caused to flow in the reactor for about 3600 seconds to deposit a GaN film 14 having a thickness of about 1 μm.

The GaN film deposited as described above had a good Zinc-blende type crystal structure and had a dislocation density slightly higher than about $10^6$ $cm^{-2}$. It was also confirmed that a surface of the GaN film had an improved flatness. A reason for this is that when even a slight amount of Al is present at an interface between the GaN film and the BP crystal film in the step of growing the GaN film, the ratio at which the GaN crystal is attached to the BP crystal film is increased and thus the GaN film is grown more certainly. It has been confirmed by an experiment that Al is preferably contained at a content of about 10% at the maximum with respect to In and that when the content of Al exceeds this level, the dislocation density is rapidly increased.

Example 4

Hereinafter, a method for growing a GaN-based crystal in example 4 will be described with reference to FIG. 1.

First, like in example 1, a BP crystal film 11 having a thickness of 500 nm is formed on a P-doped n-type Si substrate 10.

The Si substrate 10 having the BP crystal film 11 formed thereon is transferred to another reactor while being kept in a nitrogen atmosphere without being exposed to the atmosphere. The temperature of the substrate is raised to 1100° C., and a surface of the substrate is treated with hydrogen for 5 minutes. Next, the temperature of the substrate is lowered to 650° C., and $CH_3$—NH—$NH_2$ (monomethylhydrazine), $(C_2H_5)_3Ga$ (trimethylgallium), $(C_2H_5)_3Al$ (trimethylaluminum) and $(C_2H_5)_3In$ (trimethylindium) are caused to flow for 10 seconds to deposit an AlInGaN film 123 having a thickness of about 1 to several atom layers (about 0.5 to 2 nm). The AlInGaN film 123 is thin and thus keeps the Zinc-blende type crystal structure of the film therebelow.

After the AlInGaN film 123 is deposited, $CH_3$—NH—$NH_2$ (monomethylhydrazine) and $(C_2H_5)_3Ga$ (trimethylgallium) are caused to flow in the reactor for about 1500 seconds to deposit a GaN film 13 having a thickness of 20 nm.

After the GaN film 13 having a thickness of 20 nm is deposited, the temperature of the reactor is raised to 730° C., and monomethylhydrazine and $(C_2H_5)_3Ga$ (trimethylgallium) are caused to flow in the reactor for about 3600 seconds to deposit a GaN film 14 having a thickness of about 1 μm.

The GaN film deposited as described above had a good Zinc-blende type crystal structure and had a dislocation density slightly higher than about $10^6$ $cm^{-2}$. It was also confirmed that a surface of the GaN film had an improved flatness.

Example 5

Figure 2:
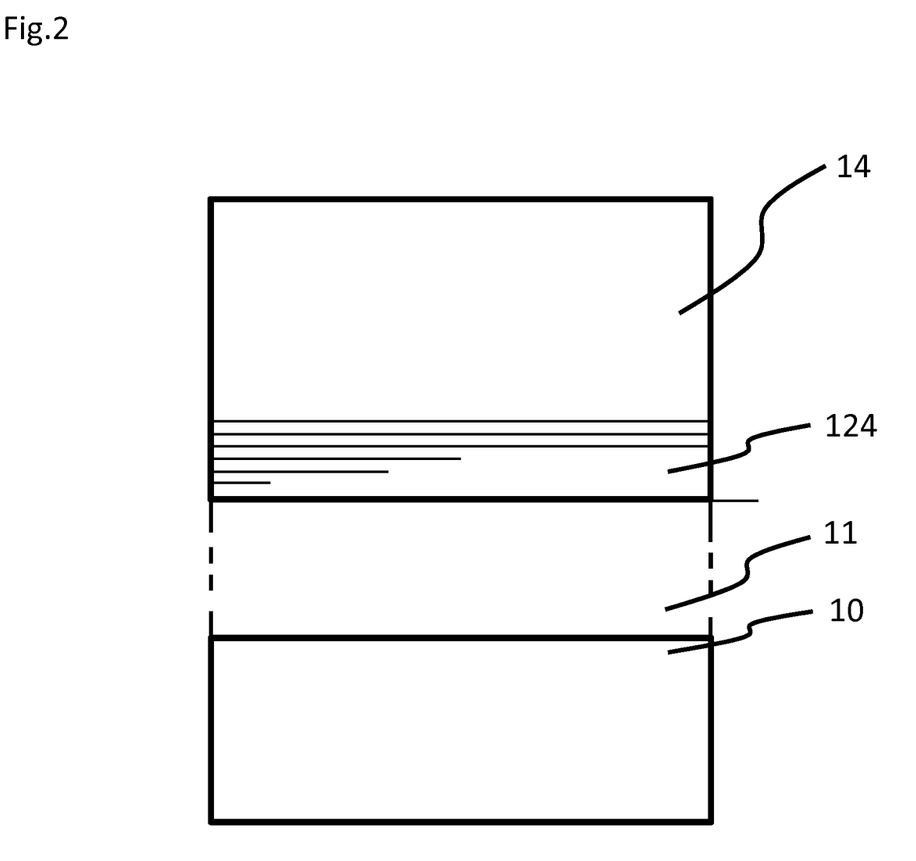
FIG. 2 is a cross-sectional view showing a post-crystal growth state in example 5 according to the present invention.

Hereinafter, a method for growing a GaN-based crystal in example 5 will be described with reference to FIG. 2.

First, like in example 1, a BP crystal film 11 having a thickness of 500 nm is formed on a P-doped n-type Si substrate 10.

The Si substrate 10 having the BP crystal film 11 formed thereon is transferred to another reactor while being kept in a nitrogen atmosphere without being exposed to atmosphere. The temperature of the substrate is raised to 1100° C., and a surface of the substrate is treated with hydrogen for 5 minutes. Next, the temperature of the substrate is lowered to 650° C. (1) $CH_3$—NH—$NH_2$ (monomethylhydrazine), $(C_2H_5)_3Ga$ (trimethylgallium) and $(C_2H_5)_3In$ (trimethylindium) are caused to flow for 10 seconds to form an InGaN layer having a thickness of 1.4 nm, and (2) $CH_3$—NH—$NH_2$ (monomethylhydrazine) and $(C_2H_5)_3Ga$ (trimethylgallium) are caused to flow for 10 seconds to form a GaN layer having a thickness of 1.4 nm. Then, the steps of (1) and (2) are repeated four times. As a result, a super-lattice layer 124 having a stacking structure of GaInN/GaN/GaInN/GaN/GaInN/GaN/GaInN/GaN/GaInN/GaN and having a total thickness of 14 nm is formed on the BP crystal film 11. The super-lattice layer 124 keeps the Zinc-blende type crystal structure of the film therebelow.

After the super-lattice layer 124 is formed, the temperature of the reactor is raised to 730° C., and monomethylhydrazine and $(C_2H_5)_3Ga$ (trimethylgallium) are caused to flow in the reactor for about 3600 seconds to deposit a GaN film 14 having a thickness of about 1 μm.

The GaN film deposited as described above had a good Zinc-blende type crystal structure and had a dislocation density of about $10^6$ $cm^{-2}$. Since the super-lattice layer 124 is formed between the BP crystal film and the GaN-based crystal, the dislocation, which may otherwise be caused from an interface between the BP crystal film and GaN-based crystal, is decreased. In addition, the super-lattice layer 124 provides an effect of absorbing newly caused strain and thus can prevent proliferation of new dislocation.

In the above-described example, the super-lattice layer 124 is formed by stacking the InGaN and GaN films. Alternatively, a super-lattice layer may be formed by repeatedly depositing $Al_xIn_yGa_{1-x-y}N$ and $Al_xIn_yGa_{1-x'-y'}N$ layers.

In the methods for growing the GaN-based crystal described above in examples 1 through 5, $PH_3$ (phosphine) and $B_2H_6$ (diborane) are used for forming the BP film. Alternatively, $PCl_3$ (phosphorus trichloride) and $BCl_3$ (boron trichloride) may be used. It has been confirmed, however, that when $PH_3$ (phosphine) and $B_2H_6$ (diborane) are used, the GaN-based crystal formed thereon has a better quality.

In the methods for growing the GaN-based crystal described above in examples 1 through 5, $PH_3$ (phosphine) and $B_2H_6$ (diborane) are used for forming the BP film. Alternatively, $PCl_3$ (phosphorus trichloride) and $BCl_3$ (boron trichloride) may be used. It has been confirmed, however, that when $PH_3$ (phosphine) and $B_2H_6$ (diborane) are used, the GaN-based crystal formed thereon has a better quality. Substantially the same effect was provided when TEGa and DMHy were used as materials.

In the methods for growing the GaN-based crystal described above in examples 1 through 5, the GaN crystal films 13 and 14 are deposited. Alternatively, an $Al_xIn_yGa_{1-x-y}N$ crystal film may be deposited. X and Y, which are composition ratios of Al and In, may each have a value in the range of 0 to 1.

(Off-Angle of the Substrate)

Figure 3:
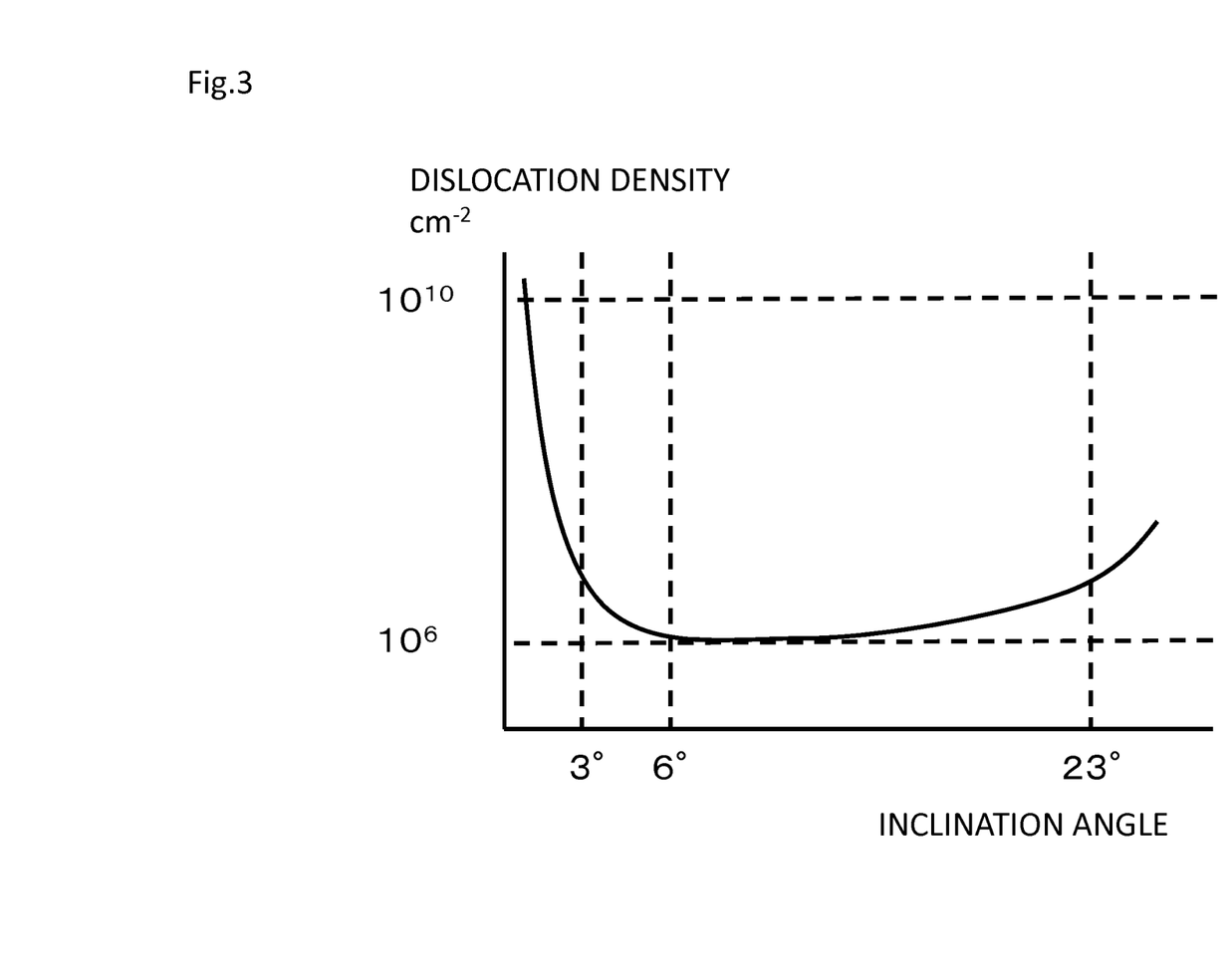
FIG. 3 is a graph showing the dependence of the defect density of a GaN-based crystal layer on the off-angle of a Si substrate in the examples according to the present invention.

In the method for growing the GaN-based crystal described above in example 1, the P-doped n-typed Si substrate 10 has the (100) plane and has an off-angle of 6 degrees. The dislocation density of a GaN-based crystal grown on the BP crystal film with an In-containing layer being located between the GaN-based crystal and the BP crystal film was measured while the inclination angle (off-angle) of the substrate was changed. FIG. 3 shows the results. In FIG. 3, the vertical axis represents the dislocation density of the GaN-based crystal, and the horizontal axis represents the off-angle of the Si substrate. As can be understood from the figure, when the off-angle of the Si substrate was 0°, the dislocation density was $10^{10}$ cm$^{-2}$. When the off-angle exceeded 3°, the dislocation density was rapidly decreased to about $10^6$ cm$^{-2}$. When the off-angle exceeded 23°, the dislocation density was increased again. It should be noted that when the off-angle was larger than 23°, the growth surface was roughened. Therefore, the off-angle of the substrate is preferably 3° or larger and 23° or smaller. From the viewpoint of the dislocation density, an optimal off-angle is in the range that is 6° or larger and 10° or smaller.

(Composition Gradient)

In the method for growing the GaN-based crystal described above in example 2, the GaN layer 13 is formed on the InGaN layer 121. Alternatively, growth may be started from an In$_x$Ga$_{1-x}$ layer (x is 0.15 or greater) while the amount of In may be decreased as the growth advances. The growth temperature needs to be 700° C. or lower, for example, about 650° C. A reason for this is that when the growth temperature is too high, a sufficient amount of In is not introduced.

(Si Concentration of the BP Crystal Film)

In the methods for growing the GaN-based crystal described above in examples 1 through 5, it is preferable that the BP crystal film 11 contains Si at a relatively high concentration. A conceivable reason for this is that the atomic bond of Si and boron is highly strong and such a bonded part suppresses expansion or proliferation of dislocation caused in the BP crystal film 11. It is preferable that the Si concentration is $10^{17}$ cm$^{-3}$ or greater and $10^{21}$ cm$^{-3}$ or less. When the Si concentration is $10^{17}$ cm-3 or less, the dislocation density of the post-growth GaN-based crystal is increased. When the Si concentration is $10^{21}$ cm$^{-3}$ or greater, the surface of the post-growth GaN-based crystal is roughened.

A very thin high-concentration Si doped layer may be provided in a part of the BP crystal film 11. Specifically, a BP crystal film having a thickness of 100 nm is formed on the Si substrate, a high-concentration Si doped BP crystal layer having a concentration of $10^{21}$ cm$^{-3}$ or greater and having a thickness of 1 to 3 nm (several atom layers) is formed thereon, and a BP crystal film having a thickness of 400 nm is formed thereon. In this manner, the high-concentration Si doped BP crystal layer is sandwiched between the BP crystal films. This suppresses expansion or proliferation of dislocation caused at an interface between the Si substrate 10 and the BP crystal film 11 or in the BP crystal film (lower film). It has been confirmed that for this reason, the dislocation density of the GaN-based crystal formed on the BP crystal film 11 with an In-containing layer being located between the GaN-based crystal and the BP crystal film 11 is decreased by about 1 digit.

(Low-Temperature Annealing)

In the methods for growing the GaN-based crystal described above in examples 1 through 5, the Si substrate 10 having the BP crystal film 11 formed thereon is transferred to another reactor while being kept in a nitrogen atmosphere without being exposed to atmosphere. Then, the temperature of the substrate is raised to 1100° C., and the surface of the substrate is treated with hydrogen for 5 minutes.

It is preferable that after this step, the temperature of the reactor is decreased to a level that is 700° C. or lower, for example, to 650° C. and is kept at this level for about 10 minutes to perform first low-temperature annealing. It is also preferable that after the In-containing layer 12 (121, 123, 124) is formed and then the GaN film 13 is formed, the temperature is kept at a level that is 800° C. or lower, for example, at 750° C. for several ten minutes to perform second low-temperature annealing. The BP crystal film 11 and the GaN film 13 that have been subjected to the first and second low-temperature annealing have an improved crystal quality and also have the defect density of the surface decreased. It has been confirmed that as a result of this, the dislocation density of the GaN layer 14 is decreased by about one digit in decimal system.

Example 6

Figure 4:
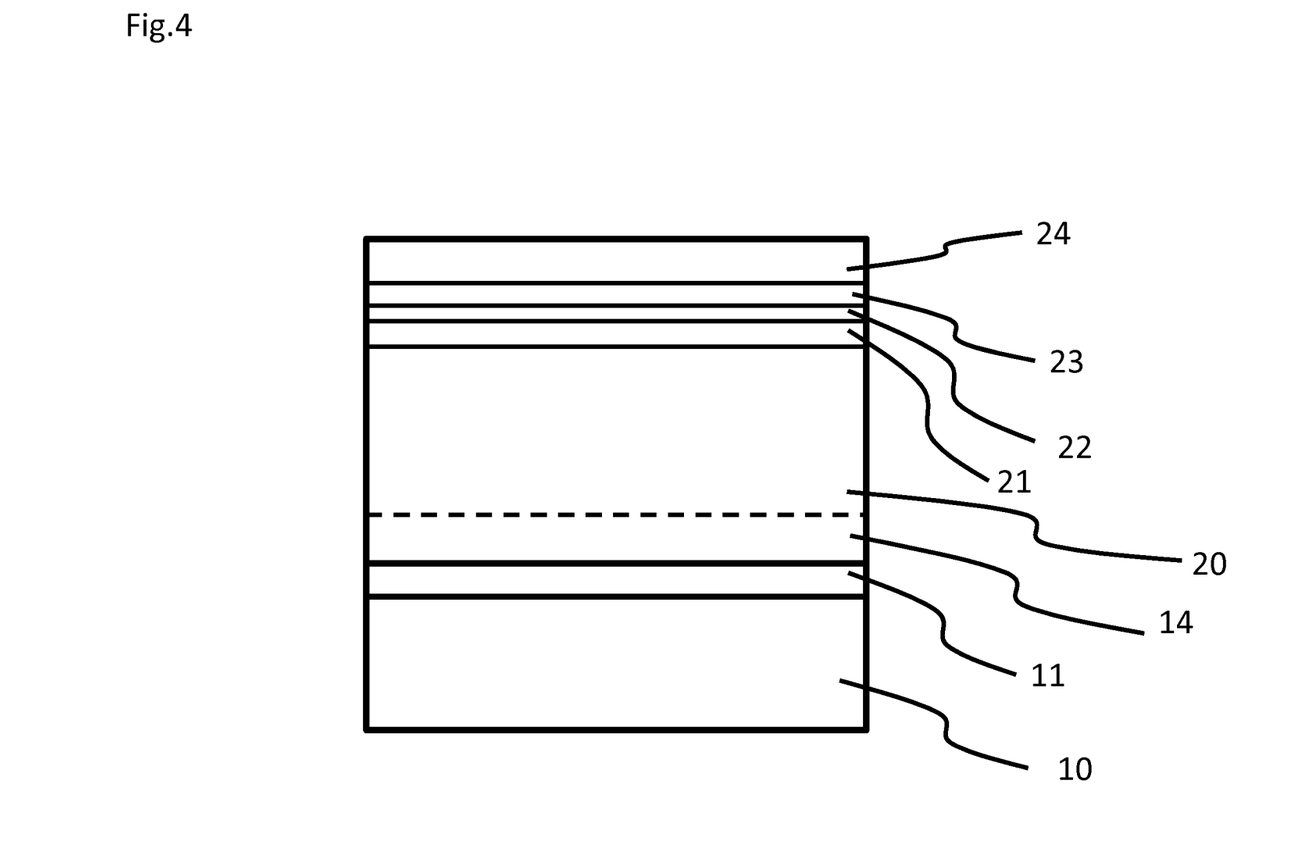
FIG. 4 is a cross-sectional view of a semiconductor laser device using a GaN-based crystal grown by a method according to the present invention.

FIG. 4 shows a semiconductor laser device using a GaN-based crystal obtained by the method for growing the GaN-based crystal described above in any of examples 1 through 5.

The GaN layer 14 obtained as described above is non-doped. On the GaN layer 14, an n-type contact layer 20 formed of a Si-doped GaN layer is provided to a thickness of about 1 μm. Next, on the n-type contact layer 20, an n-type clad layer 21 formed of a Si-doped AlGaN layer is provided to a thickness of about 0.1 μm. On the n-type clad layer 21, GaN (2 nm) and InGaN (2 nm) are alternately stacked in 6 cycles to form a super-lattice layer having a thickness of 24 nm as an active layer 22. The active layer 22 is non-doped. Next, on the active layer 22, a p-type clad layer 23 formed of a Mg-doped AlGaN layer is provided. On the p-type clad layer 23, a p-type contact layer 20 formed of a Mg-doped GaN layer is provided to a thickness of about 400 nm. Then, the layers 20 through 24 are removed by etching such that a stripe-shaped area having a width of 5 μm is left for laser oscillation. An electrode is formed on each of the n-type contact layer 20 and the p-type contact layer 24.

The semiconductor laser device thus obtained contains a Zinc-blende type GaN crystal. For this reason, holes and electrons are recombined highly efficiently. Thus, the semiconductor laser device has a high light emission efficiency. In the case where an optical device such as a semiconductor laser device or the like is formed by use of a Zinc-blende type GaN crystal, an n-type clad layer is indispensable in order to prevent the holes from leaking, since a Zinc-blende type GaN crystal have a very high mobility. Therefore, the semiconductor laser device preferably has a double-hetero-junction structure.

Example 7

Figure 5:
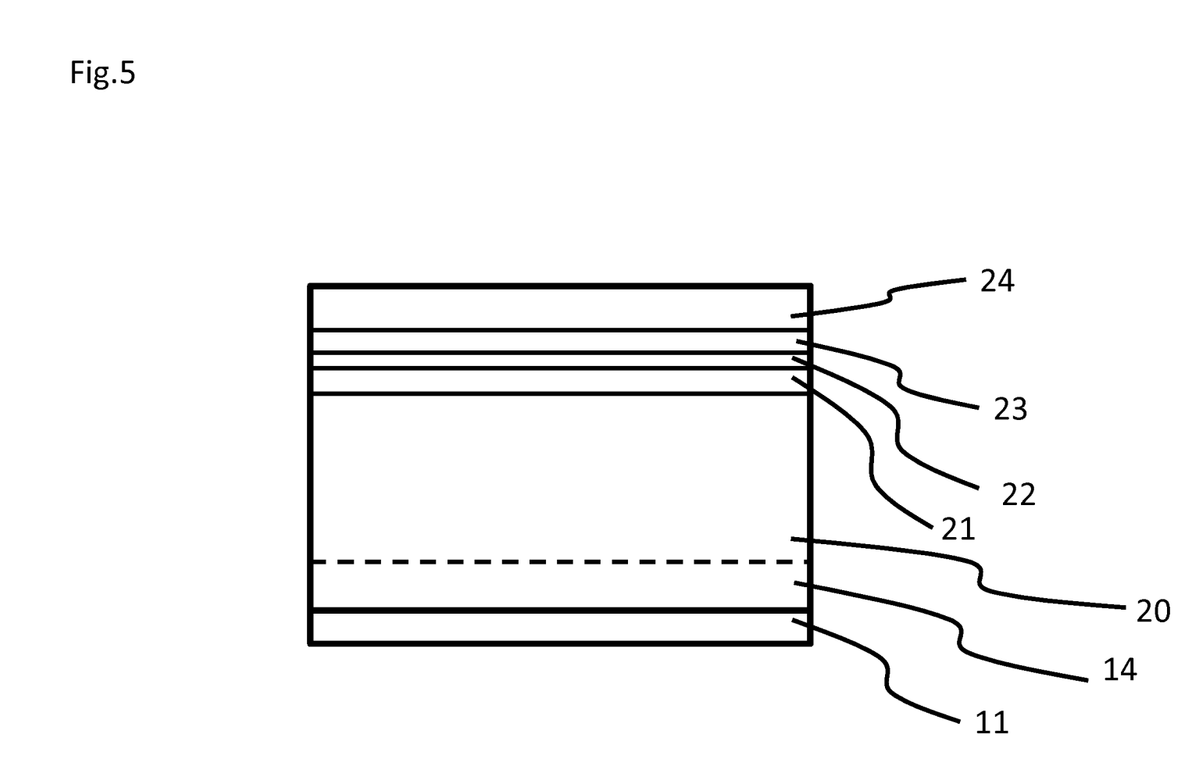
FIG. 5 is a cross-sectional view showing a method for producing a high-luminance light emitting diode using a GaN-based crystal grown by a method according to the present invention.
Figure 6:
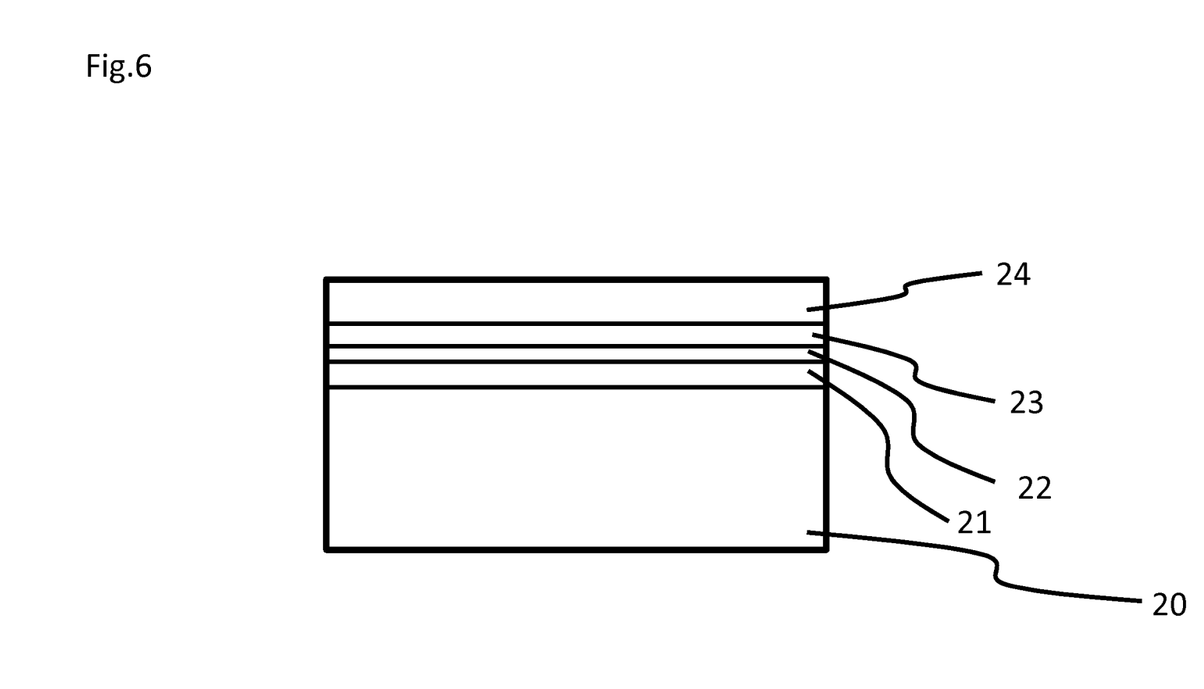
FIG. 6 is a cross-sectional view showing the method for producing the high-luminance light emitting diode using the GaN-based crystal grown by the method according to the present invention.
Figure 7:
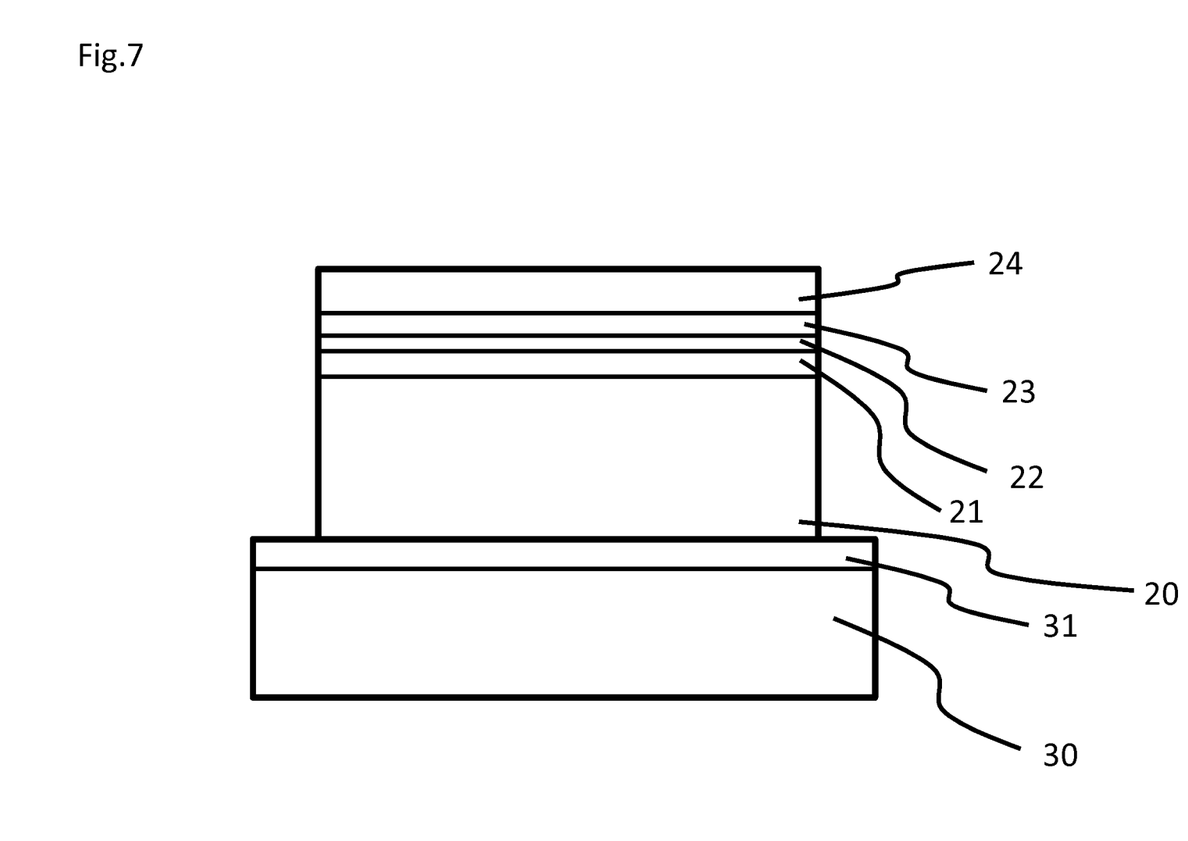
FIG. 7 is a cross-sectional view showing the method for producing the high-luminance light emitting diode using the GaN-based crystal grown by the method according to the present invention.

FIG. 5 through FIG. 7 show a method for producing a high-luminance light emitting diode using a GaN-based crystal obtained by the method for growing the GaN-based crystal described above in any of examples 1 through 5.

The GaN layer 14 is non-doped as described above. On the GaN layer 14, an n-type contact layer 20 formed of a Si-doped GaN layer is provided to a thickness of about 1 μm. Next, on the n-type contact layer 20, an n-type clad layer 21 formed of a Si-doped AlGaN layer is provided to a thickness of about 0.1 μm. On the n-type clad layer 21, GaN (2 nm) and InGaN (2 nm) are alternately stacked in 6 cycles to form a super-lattice layer having a thickness of 24 nm as an active layer 22. The active layer 22 is non-doped. Next, on the active layer 22, a p-type clad layer 23 formed of a Mg-doped AlGaN layer is provided. On the p-type clad layer 23, a p-type contact layer 20 formed of a Mg-doped GaN layer is provided to a thickness of about 400 nm. (Up to this point, the method is the same as the method for producing the laser device in example 6.)

In order to allow an LED of such a double-heterojunction structure to provide a high luminance, it is preferable that the Si substrate 10 that absorbs light of ultraviolet to blue wavelengths among generated light is removed. Thus, the Si substrate 10 is removed by use of the BP crystal layer 11 as an etching stopper. As an etching solution capable of selectively etching the Si substrate 10 against the BP crystal layer 11, KOH (potassium hydroxide) having a temperature of 500° C. is usable. FIG. 5 shows a state where the Si substrate 10 has been removed by use of 500° C. KOH (potassium hydroxide). Substantially the same good result was obtained in the case where a diluted mixture solution of hydrogen fluoride and nitric acid, a hydrazine solution or the like was used as the etching solution for the Si substrate 10.

Next, the BP crystal layer 11 is removed. In this step, the BP crystal layer needs to be selectively etched against the GaN layer (including a very thin In-containing layer). Herein, a mixture solution of KOH (potassium hydroxide), NaOH (sodium hydroxide) and MgO (magnesium oxide) is heated to 500° C. to be used as an etching solution. In this manner, the BP crystal layer can be removed.

For removing the BP crystal layer, phosphoric acid heated to 500° C. may be used alternatively. Because of the relationship between the etching rate and the etching selectivity, a mixture solution of KOH (potassium hydroxide), NaOH (sodium hydroxide) and MgO (magnesium oxide) is more preferable.

Next, the non-doped GaN layer 14 is removed by etching. In this step, as the etching solution, KOH (potassium hydroxide) having a temperature of 500° C. is usable. As a result, the n-type contact layer 20 having a high conductivity is exposed. FIG. 6 shows this state.

Separately, an assembly member including a Si substrate 30 and an aluminum film 31 that has a property of reflecting light of ultraviolet to blue wavelengths and is formed on a surface of the Si substrate 30 by sputtering is prepared. The assembly member and the n-type contact layer 20 are joined together. The assembly member and the n-type contact layer 20 are pressure-contacted to each other at 400° C. by use of an alloy of Au and In to be joined together. FIG. 7 shows this state.

The substrate having the high-luminance LED, formed in this manner, mounted thereon is divided into individual devices by a die saw or the like. Each individual device is mounted on a package (not shown), and a light emitting surface (top surface in FIG. 7) is enclosed by a fluorescent element (that converts ultraviolet or blue light into white light). Thus, the high-luminance LED is produced as a product.

As described above, according to the present invention, a Zinc-blende type GaN-based crystal having a low dislocation density is obtained. Thus, a high-efficiency light emitting device using the Zinc-blende type GaN-based crystal can be formed.

What is claimed is:

1. A method for producing a GaN-based crystal, comprising:
    forming a BP crystal layer of a Zinc-blende type structure on a Si substrate;
    forming an In-containing layer, on the BP crystal layer, with such a thickness as to keep the Zinc-blende type structure;
    forming a first GaN-based crystal layer of the Zinc-blende type structure on the In-containing layer; and
    forming a second GaN-based crystal layer of the Zinc-blende type structure on the first GaN-based crystal layer,
    thereby a double-heterojunction is formed.

2. The method for producing a GaN-based crystal according to claim 1, wherein the In-containing layer is a metallic In layer having a thickness of 4 atom layers or less.

3. The method for producing a GaN-based crystal according to claim 1, wherein the In-containing layer is an InGaN layer having a thickness of 2 nm or less.

4. The method for producing a GaN-based crystal according to claim 1, wherein the In-containing layer is an InAl mixture layer having a thickness of 4 atom layers or less and contains Al at a content of 10% or less.

5. The method for producing a GaN-based crystal according to claim 1, wherein the In-containing layer is an AlIn-GaN layer having a thickness of 2 nm or less and contains Al at a content of 10% or less.

6. The method for producing a GaN-based crystal according to claim 1, wherein the In-containing layer is a super-lattice layer obtained by repeatedly stacking $Al_xIn_yGa_{1-x-y}N$ and $Al_xIn_yGa_{1-x'-y}N$ layers.

7. The method for producing a GaN-based crystal according to claim 1, wherein the Si substrate has an off-angle of 3° or greater and 23° or less with respect to a (100) plane.

8. The method for producing a GaN-based crystal according to claim 1, wherein the BP crystal layer has a Si concentration of $10^{17}$ cm$^{-3}$ or greater and $10^{21}$ cm$^{-3}$ or less.

9. A method for producing a GaN-based crystal, comprising:
    forming a BP crystal layer of a Zinc-blende type structure that has a Si concentration of $10^{17}$ cm$^{-3}$ or greater and $10^{21}$ cm$^{-3}$ or less on a Si substrate;
    forming a first GaN-based crystal layer of the Zinc-blende type structure at a position above the BP crystal layer; and
    forming a second GaN-based crystal layer of the Zinc-blende type structure on the first GaN-based crystal layer,
    thereby a double-heterojunction is formed.

10. A light emitting device, comprising: the first GaN-based crystal produced by the method according to claim 1; and a double-heterojunction formed on the GaN-based crystal.

11. A method for producing a light emitting device according to claim 1, comprising: removing, from the first GaN-based crystal, the Si substrate by use of the BP crystal layer as an etching stopper.

* * * * *